United States Patent
Nallam et al.

(10) Patent No.: US 10,348,897 B2
(45) Date of Patent: Jul. 9, 2019

(54) SYSTEM AND METHOD FOR REDUCING STORAGE SPACE IN A CONTACT CENTER

(71) Applicant: Avaya Inc., Basking Ridge, NJ (US)

(72) Inventors: Bhanu Venkata Nagesh Nallam, Hyderabad (IN); Srinivasa Rao Samineni, Hyderabad (IN)

(73) Assignee: Avaya Inc., Santa Clara, CA (US)

( * ) Notice: Subject to any disclaimer, the term of this patent is extended or adjusted under 35 U.S.C. 154(b) by 0 days.

(21) Appl. No.: 15/634,369

(22) Filed: Jun. 27, 2017

(65) Prior Publication Data

US 2018/0375997 A1 Dec. 27, 2018

(51) Int. Cl.
| | |
|---|---|
| H03M 7/30 | (2006.01) |
| H04L 12/58 | (2006.01) |
| H04M 3/22 | (2006.01) |
| H04M 3/42 | (2006.01) |
| H04M 3/51 | (2006.01) |
| G06F 11/14 | (2006.01) |
| G06F 16/174 | (2019.01) |

(52) U.S. Cl.
CPC ....... *H04M 3/5175* (2013.01); *G06F 11/1448* (2013.01); *G06F 16/1744* (2019.01); *H03M 7/30* (2013.01); *H04L 51/08* (2013.01); *H04L 51/16* (2013.01); *H04M 3/2218* (2013.01); *H04M 3/42221* (2013.01); *H04M 3/51* (2013.01); *G06F 2201/865* (2013.01); *G06F 2212/401* (2013.01); *H04M 2203/554* (2013.01); *H04M 2203/559* (2013.01)

(58) Field of Classification Search
CPC ... H04L 51/08; H04L 51/16; G06F 2212/401; G06F 11/1448; G06F 16/1744; G06F 2201/865; H03M 7/30; H04M 3/5175; H04M 3/2218; H04M 3/42221; H04M 3/51; H04M 2203/554; H04M 2203/559
See application file for complete search history.

(56) References Cited

U.S. PATENT DOCUMENTS

| | | | |
|---|---|---|---|
| 4,486,853 A * | 12/1984 | Parsons | H04L 12/1804 345/418 |
| 6,704,772 B1 | 3/2004 | Ahmed et al. | |
| 7,460,032 B2 | 12/2008 | Boldt et al. | |
| 8,554,939 B1 * | 10/2013 | Tong | G06F 3/04817 370/338 |

(Continued)

FOREIGN PATENT DOCUMENTS

WO 2006063057 A2 6/2006

*Primary Examiner* — Lisa Hashem
(74) *Attorney, Agent, or Firm* — Stevens & Showalter LLP

(57) ABSTRACT

Storing a message in a conversation involving a contact of a contact center and an agent of the contact center includes receiving, by a computer of the contact center, the message, wherein the conversation comprises a plurality of messages and then a) identifying redundant information in the received message that is redundant based on one or more of the plurality of messages; and b) identifying derivable information that is derivable from a data source external to the received message. Next, a modified message is generated by eliminating the redundant information and the derivable information from the received message; and the modified message is stored. The modified message can include a number of separate parts, each selectively compressed by a respective compression algorithm.

20 Claims, 7 Drawing Sheets

(56) References Cited

U.S. PATENT DOCUMENTS

| | | | |
|---|---|---|---|
| 8,849,919 B2 | 9/2014 | Gerstl et al. | |
| 8,972,684 B2 | 3/2015 | Resch et al. | |
| 9,230,240 B2 | 1/2016 | Iwasaki et al. | |
| 2006/0178134 A1* | 8/2006 | Adams | G06Q 10/107 455/413 |
| 2009/0171990 A1* | 7/2009 | Naef, III | G06Q 10/06 |
| 2009/0282086 A1* | 11/2009 | Heimes | H04L 51/12 |
| 2011/0142071 A1* | 6/2011 | Farrell | H04L 51/16 370/473 |
| 2012/0137059 A1* | 5/2012 | Yang | G06F 3/0611 711/104 |
| 2012/0166554 A1* | 6/2012 | Preece | H04L 12/66 709/206 |
| 2012/0185797 A1* | 7/2012 | Thorsen | G06Q 10/00 715/784 |
| 2012/0310890 A1* | 12/2012 | Dodd | G06F 17/30073 707/646 |
| 2013/0346379 A1* | 12/2013 | Loe | H04L 63/0428 707/693 |
| 2014/0081984 A1 | 3/2014 | Sitsky et al. | |
| 2015/0195225 A1* | 7/2015 | Albert | H04L 51/063 709/206 |
| 2015/0201062 A1* | 7/2015 | Shih | H04M 1/72552 455/564 |
| 2015/0287217 A1* | 10/2015 | Huang | H04N 19/40 382/244 |
| 2017/0093775 A1* | 3/2017 | Allen | H04L 51/16 |
| 2017/0230505 A1* | 8/2017 | McCarthy-Howe | H04L 51/08 |

\* cited by examiner

SYSTEM AND METHOD FOR REDUCING STORAGE SPACE IN A CONTACT CENTER

BACKGROUND

Embodiments of the present disclosure generally relate to storing data related to contact center interactions, and, in particular, to reducing the amount of storage space needed to store that data.

Many new products and services offer specialized online customer support which has resulted in an increase in the number of contact centers. Additionally, because technology now allows these contact centers to provide multimedia-based support, interactions with customers now involve text data, voice data, video data, chat data, e-mail attachments, image data, and a combination of one or more of these different types of data. Thus, large amounts of data may now be received and generated by a contact center which the contact center may need to store.

The contact center may want to store some of this data for business reasons and may be required to store some of this data for regulatory reasons. Thus, large amounts of storage space may be needed to store the vast amounts and types of data that is created during interactions between a contact center and its customers.

BRIEF SUMMARY

One aspect of the present disclosure relates to a method for storing a message in a conversation involving a contact of a contact center and an agent of the contact center The method includes receiving, by a computer of the contact center, the message, wherein the conversation comprises a plurality of messages; identifying, by the computer of the contact center, redundant information in the received message that is redundant based on one or more of the plurality of messages; and identifying, by the computer of the contact center, derivable information that is derivable from a data source external to the received message. The method continues with generating, by the computer of the contact center, a modified message by eliminating the redundant information and the derivable information from the received message; and storing, by the computer of the contact center, the modified message. In accordance with this aspect, the data source is one or more of the plurality of messages, one or more files stored in a memory accessible by the computer of the contact center, or a combination of both.

In another aspect, the modified message comprises a plurality of separate parts, each having a corresponding, respective data type and the method includes separately compressing, by the computer of the contact center, each of the plurality of separate parts. Afterwards, the computer of the contact center combines the separately compressed parts into a unit, wherein storing the modified message comprises storing the unit. Further, the method can include selecting, by the computer of the contact center, a respective compression algorithm for each of the separate parts based on their corresponding data type.

Storing of the modified message, according to one aspect of the present disclosure can include storing an entry in a metadata repository corresponding to the received message; and storing an entry in a content repository corresponding to the received message. In particular, the content repository comprises a plurality of entries corresponding to the plurality of messages and the entry in the metadata repository can be linked with one or more of the plurality of entries of the content repository that include content from which the derivable information is identified. Also, the entry in the metadata repository can be linked with one or more of the plurality of entries of the content repository that include content from which the redundant information is identified.

Another aspect of the present disclosure relates to a system for storing a message in a conversation involving a contact of a contact center and an agent of the contact center, that includes a memory device storing executable instructions and a processor in communication with the memory device. In particular, executing the executable instructions by the processor causes the processor to: a) receive the message, wherein the conversation comprises a plurality of messages; b) identify redundant information in the received message that is redundant based on one or more of the plurality of messages; c) identify derivable information that is derivable from a data source external to the received message; d) generate a modified message by eliminating the redundant information and the derivable information from the received message; and e) store the modified message.

In accordance with this aspect, the data source is one or more of the plurality of messages, one or more files stored in a memory accessible by the computer of the contact center, or a combination of both.

In another aspect, the modified message comprises a plurality of separate parts, each having a corresponding, respective data type and processor separately compresses each of the plurality of separate parts. Afterwards, the processor combines the separately compressed parts into a unit, wherein storing the modified message comprises storing the unit. Further, the processor can select a respective compression algorithm for each of the separate parts based on their corresponding data type.

Storing of the modified message, according to one aspect of the present disclosure can include storing an entry in a metadata repository corresponding to the received message; and storing an entry in a content repository corresponding to the received message. In particular, the content repository comprises a plurality of entries corresponding to the plurality of messages and the entry in the metadata repository can be linked with one or more of the plurality of entries of the content repository that include content from which the derivable information is identified. Also, the entry in the metadata repository can be linked with one or more of the plurality of entries of the content repository that include content from which the redundant information is identified.

BRIEF DESCRIPTION OF THE DRAWINGS

So the manner in which the above recited features of the present disclosure may be understood in detail, a more particular description of embodiments of the present disclosure, briefly summarized above, may be had by reference to embodiments, which are illustrated in the appended drawings. It is to be noted, however, the appended drawings illustrate only typical embodiments encompassed within the scope of the present disclosure, and, therefore, are not to be considered limiting, for the present disclosure may admit to other equally effective embodiments, wherein.

DETAILED DESCRIPTION

Figure 1:
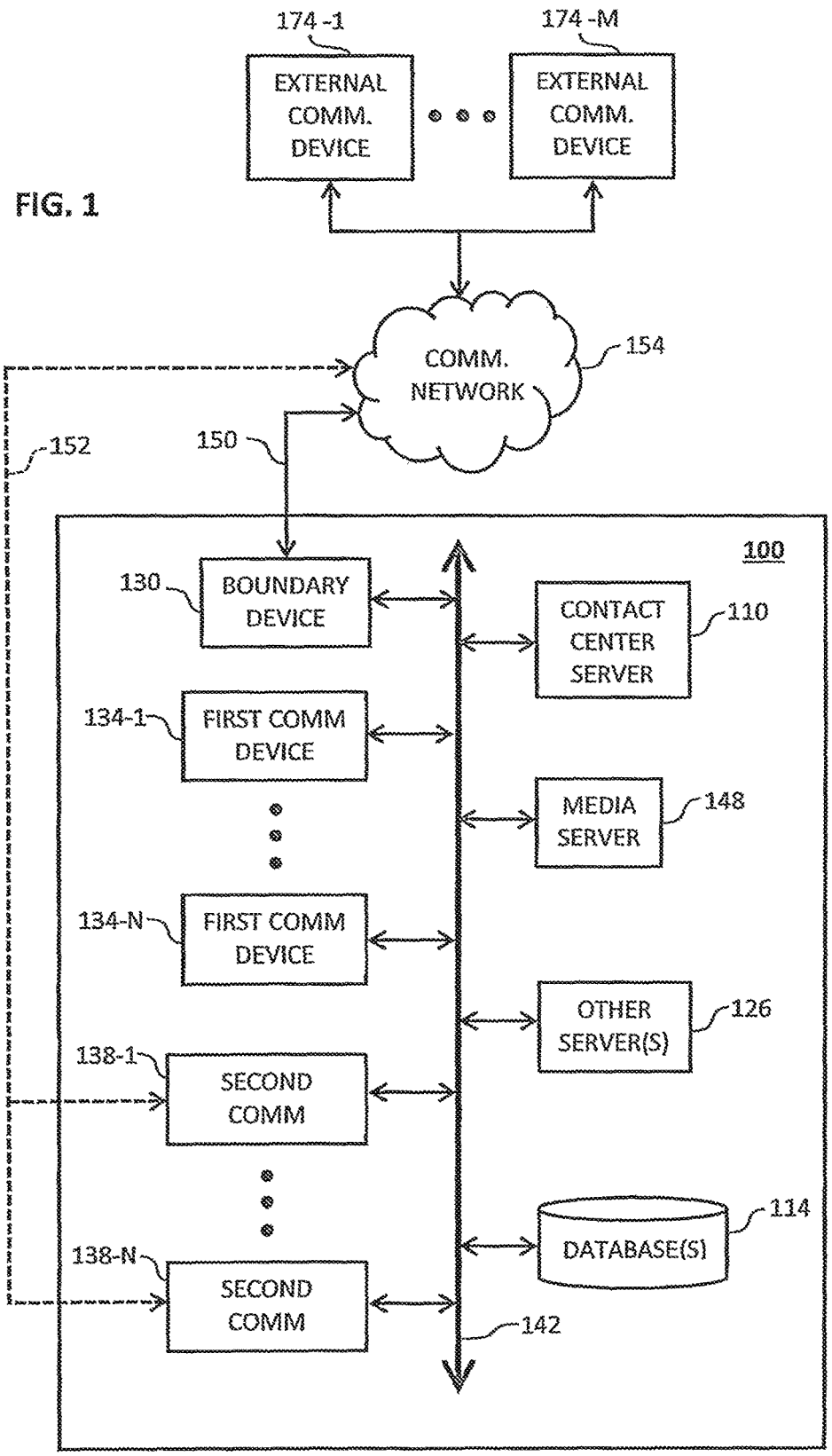
FIG. 1 illustrates a communications system architecture in accordance with the principles of the present disclosure.

The present disclosure will be illustrated below in conjunction with an exemplary communications system. Although well suited for use with, e.g., a system having an Automated Call or Contact Distribution (ACD) system or other similar contact processing switch, the present disclosure is not limited to any particular type of communications system switch or configuration of system elements. Those skilled in the art will recognize that the disclosed techniques may be used in any communications application in which it is desirable to provide improved contact processing.

In the following detailed description, numerous specific details are set forth in order to provide a thorough understanding of embodiments or other examples described herein. In some instances, well-known methods, procedures, components and circuits have not been described in detail, so as to not obscure the following description. Further, the examples disclosed are for illustrative purposes only and should not be construed as limiting of the scope of embodiments of the present disclosure.

The term "a" or "an" entity refers to one or more of that entity. As such, the terms "a" (or "an"), "one or more," and "at least one" may be used interchangeably herein. It is also to be noted that the terms "comprising," "including," and "having" may be used interchangeably.

The term "automatic" and variations thereof, as used herein, refers to any process or operation done without material human input when the process or operation is performed. However, a process or operation may be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The term "computer-readable medium" as used herein refers to any tangible storage and/or transmission medium that participates in storing and/or providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, RAM, PROM, EPROM, FLASH-EPROM, solid state medium like a memory card, any other memory chip or cartridge, a carrier wave as described hereinafter, or any other medium from which a computer may read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

As used herein in connection with embodiments of the present disclosure, the term "contact" refers to a communications from a user or customer. The communications may be by way of any communications medium such as, but not limited to, a telephone call, e-mail, instant message, web chat, and the like. The terms "user" and "customer" denote a party external to the contact center and are used herein to refer to the other party to a contact or a communications session. A user or customer may include, for example, a person requesting assistance for himself or herself or a person requesting assistance for a third party and may also include, for example, a person having a commercial relationship with the contact center or with a business represented by the contact center.

For each "contact" received by the contact center, a computer of the contact center will instantiate a "contact object," which may comprise one or more variables, functions, and data structures that represent the contact. Each contact object comprises a number of attributes, which are assigned values based on its corresponding contact. Each contact object can also include pointers, links or references to other data and/or attributes associated with its corresponding contact. The contact object may be passed amongst the different queues, databases, systems, software applications and other computer-based resources of the contact center. Each contact object may also include a forward reference to another contact object and a backward reference to yet another contact object. In this manner, a prioritized list, or queue, of contact objects may be constructed. A "contact object" is often referred to herein as a "contact" as shorthand because it is clear, in context, that the computer manipulated contact object is what is being described.

The terms "determine," "calculate," and "compute," and variations thereof, as used herein, are used interchangeably and include any type of methodology, process, mathematical operation or technique.

As used herein, the term "gateway" may generally comprise any device that sends and receives data between devices. For example, a gateway may comprise routers, switches, bridges, firewalls, other network elements, and the like, and any combination thereof.

The term "module" as used herein refers to any known or later developed hardware, software, firmware, artificial intelligence, fuzzy logic, or combination of hardware and software that is capable of performing the functionality associated with that element. Also, while the present disclosure is described in terms of exemplary embodiments, it should be appreciated those individual aspects of the present disclosure may be separately claimed.

As used herein, the term "signal" may include one or more of an electrical signal, a radio signal, an optical signal, an acoustic signal, and so forth.

The terms "switch," "server," "contact center server," or "contact center computer server" as used herein should be understood to include a Private Branch Exchange (PBX), an ACD system, an enterprise switch, or other type of telecommunications system switch or server, as well as other types of processor-based communications control devices such as, but not limited to, media servers, computers, adjuncts, and the like.

Automatic Call or Contact Distribution (ACD) is a communications server software feature that processes incoming, outgoing, and internal calls and distributes them to groups of extensions called hunt groups or splits. The communications server also sends information about the operation of the ACD to a Call Management System (CMS) which stores and formats the data and produces real-time and historical reports on ACD activity. ACD is used by a contact center to route incoming calls to specifically assigned splits/skills and agents. ACD allows a system administrator to create an efficient call management environment.

One or more embodiments of the present disclosure may utilize Session Initiation Protocol (SIP) as a communications protocol. SIP is a communications protocol that is known and described in Internet Engineering Task Force (IETF) Request For Comment (RFC) 3261, the content of which is hereby incorporated by reference in its entirety. SIP is an open signaling protocol for establishing many kinds of real-time communications sessions. Examples of the types of communications sessions that may be established using SIP include voice, video, and/or instant messaging. SIP also facilitates peer-to-peer communications sessions. These communications sessions may be carried out on any type of communications device such as a personal computer, laptop computer, Personal Digital Assistant, telephone, mobile phone, cellular phone, or the like. One key feature of SIP is its ability to use an end-user's Address of Record (AOR) as a single unifying public address for all communications. Thus, in a world of SIP-enhanced communications, a user's AOR becomes their single address that links the user to all of the communications devices associated with the user. Using this AOR, a caller can reach any one of the user's communications devices, also referred to as User Agents (UAs) without having to know each of the unique device addresses or phone numbers.

Users or any other addressable entities in a SIP framework are identified by Universal Resource Identifiers (URI). Each such Internet-style address (for example, sip:johndoe@avaya.com) maps into one or more Contacts, each of which typically represents a device or service at which the corresponding user may be reached. Examples include phones, desktop multimedia clients, instant message accounts, e-mail accounts and so on. The SIP framework is responsible for routing a request for a peer-to-peer session addressed to a given URL to one or more appropriate contacts for that URL. The SIP framework may utilize information about the preferences, presence, and location of the user identified by the URL to determine the most appropriate contacts. The protocol also provides mechanisms to specify the type of session that is requested, as well as means to change session parameters.

SIP is not a vertically integrated communications system. Rather, SIP is a component that may be used with other IETF protocols to build a complete multimedia architecture. Typically, these architectures will include protocols such as Real-Time Transport Protocol (RTP) (RFC 3550) for transporting real-time data and providing Quality of Service (QoS) feedback, the Real-Time Streaming Protocol (RTSP) (RFC 2326) for controlling delivery of streaming media, the Media Gateway Control Protocol (MEGACO) (RFC 3015) for controlling gateways to the Public Switched Telephone Network (PSTN), and the Session Description Protocol (SDP) (RFC 4566) for describing multimedia sessions. Therefore, SIP may be used in conjunction with other protocols in order to provide complete services to the users. However, the basic functionality and operation of SIP does not depend on any of these protocols.

The Real-Time Transport Control Protocol (RTCP) is a protocol that is known and described in IETC RFC 3550. RTCP provides out-of-band statistics and control information for an RTP media stream. It is associated with RTP in the delivery and packaging of a media stream but does not transport the media stream itself. Typically, the RTP media stream will be sent on an even-numbered user datagram protocol (UDP) port, with RTCP messages being sent over the next higher odd-numbered port. RTCP may be used to provide feedback on the QoS in media distribution by periodically sending statistics information to participants in a streaming multimedia session. Systems implementing RTCP gather statistics for a media connection and information such as transmitted octet and packet counts, lost packet counts, jitter, and round-trip delay time. An application program may use this information to control QoS parameters, for instance by limiting a flow rate or by using a different codec.

FIG. 1 shows an illustrative embodiment of a communications system comprising a contact center 100 according to the present disclosure. The contact center 100 is in communications with one or more external communications devices 174-1 to 174-M via a communications link 150 and a communications network 154, where M is an integer, M≥1. The external communications devices 174-1 to 174-M are associated with one or more contacts or customers and may comprise, for example, cellular phones, laptops, Personal Computers (PCs), Personal Digital Assistants (PDAs), digital phones, analog phones, and the like. The external communications devices 174-1 to 174-M may be configured to support one or more types of streaming media such as an audio media stream and/or a video media stream. The communications network 154 may be packet-switched and/or circuit-switched and may comprise, for example, a Wide Area Network (WAN) such as the Internet, a PSTN, a Plain Old Telephone Service (POTS) network, a cellular communications network, or combinations thereof. A packet-switched network may comprise any data and/or distributed processing network and typically includes proxies (not shown), registrars (not shown), and routers (not shown) for managing packet flows. A circuit-switched network may comprise a plurality of trunks (not separately labeled).

Figure 2:
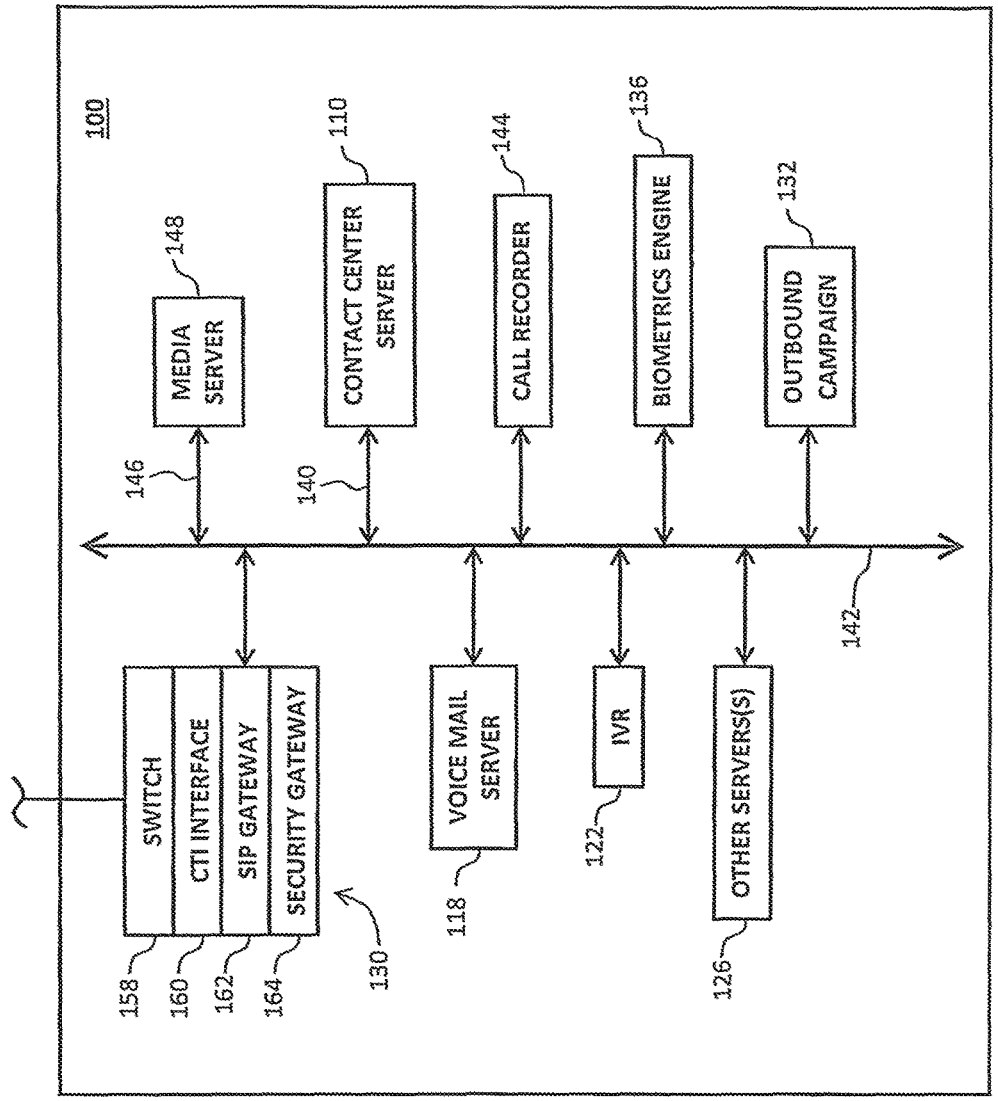
FIG. 2 illustrates aspects of a contact center in accordance with principles of the present disclosure.

As explained in more detail with respect to FIG. 2, the contact center 100 comprises a boundary device 130, a central contact center server 110, a media server 148, one or more other servers 126, and a set of data stores or databases 114 (see FIG. 1) within the contact center 100 containing contact- or customer-related information and other information that may enhance the value and efficiency of the contact processing. Some or all of the components of the contact center 100 may be interconnected by a network 142 such as a local area network (LAN) or WAN. Although one central contact center server 110 is depicted in FIG. 1, two or more servers 110 may be provided in a single contact center 100 or across multiple separate LANs 142 owned and operated by a single enterprise, but separated by the communications network 154. Likewise, two or more media servers 148 may be provided in the contact center 100. In configurations where the contact center 100 includes two or more servers 110 and/or media servers 148, each server 110, 148 may comprise similar functionality, but may be provisioned for providing its features to only a subset of all contact center users. In addition, it should be understood that some or all of the functions depicted in FIGS. 1-3 may be co-hosted and/or co-resident on a single server and/or processor.

The contact center 100 further comprises a plurality of working agents operating packet-switched (first) communications devices 134-1 to 134-N (such as computer workstations or personal computers) and/or circuit-switched (second) communications devices 138-1 to 138-N, where N is an integer, N≥1. The first agent communications devices 134-1 to 134-N may include, for example, IP hardphones such as the 4600 Series IP Phones™ by Avaya Inc., IP softphones such as the IP Softphone™ by Avaya Inc., Personal Digital Assistants (PDAs), Personal Computers (PCs), laptops, packet-based H.320 video phones and conferencing units, packet-based voice messaging and response units, packet-based traditional computer telephony adjuncts, peer-to-peer based communications devices, and any other suitable communications device. In one configuration, the server 110, the network 154, and the first agent communications devices 134-1 to 134-N are SIP compatible and may include interfaces for various other protocols such as the Lightweight Directory Access Protocol (LDAP), H.248, H.323, Simple Mail Transfer Protocol (SMTP), IMAP4, ISDN, E1/T1, and analog line or trunk. The second agent communications devices 138-1 to 138-N may each correspond to one of a set of internal extensions Ext1 to ExtN, respectively, and may include, for example, wired and wireless telephones, PDAs, H.320 videophones and conferencing units, voice messaging and response units, traditional computer telephony adjuncts, and any other suitable communications device. The second agent communications devices 138-1 to 138-N may be in communications with the external communications devices 174-1 to 174-M via one or more link(s) 152. The link(s) 152 is depicted with a dashed line to indicate that it represents a logical representation of the connections between the external communications devices 174-1 to 174-M and the second communications devices 138-1 to 138-N. The actual, physical connection between these devices can include various routing through the network 142, possibly the boundary device 130, and one or more of the servers 110, 148, 126.

It should be noted that the present disclosure does not require any particular type of information transport medium between the components of the contact center 100, i.e., the present disclosure may be implemented with any desired type of transport medium as well as combinations of different types of transport channels. It should also be emphasized that the configuration of the elements of the contact center 100 as shown in FIG. 1 is for purposes of illustration only and should not be construed as limiting the disclosure to any particular arrangement of elements.

FIG. 2 illustrates aspects of a contact center 100 in accordance with principles of the present disclosure comprising a boundary device 130, a contact center server 110, a media server 148, a call recorder 144, a biometrics engine 136, and an outbound campaign 132. The contact center 100 may also comprise a plurality of additional servers, namely a voice mail server 118, an Interactive Response unit (e.g., IVR) 122, and one or more other servers 126. Although depicted as separate servers and/or applications, it should be appreciated that some or all of the functions depicted in FIG. 2 may be co-hosted and/or co-resident on a single server and/or processor, e.g. the contact center server 110.

The contact center server 110 and the media server 148 may each be connected to the LAN 142 via its own respective communications link 140, 146, as shown, or via the switch 158 (not shown). The contact center server 110 may also be connected via one or more optional communications links (not shown) to one or more other components of the contact center 100, including for example, the media server 148, the call recorder 144, the biometrics engine 136, and the outbound campaign 132. As will be appreciated, the one or more other servers 126 may also include a scanner (which is normally not connected to the switch 130), VoIP software, video call software, voice messaging software, an IP voice server, a fax server, a web server, an e-mail server, and the like.

The boundary device 130 may include the functionality of one or more of a switch 158, a computer-telephony integration (CTI) interface 160, a SIP gateway 162, or a security gateway 164. The switch 158 and/or server 110 may comprise any architecture for directing contacts to the one or more agent communications devices 134, 138 (see FIG. 1). In some embodiments, the switch 158 may perform load-balancing functions by allocating incoming or outgoing contacts among a plurality of logically and/or geographically distinct contact centers 100. Illustratively, the switch 158 and/or server 110 may be a modified form of the subscriber-premises equipment sold by Avaya Inc. under the names Definity™ PBX-based ACD system, MultiVantage™ PBX, Communication Manager™, S8300™ media server and any other media servers, SIP Enabled Services™, Intelligent Presence Server™, and/or Avaya Interaction Center™, and any other products or solutions offered by Avaya or another company. Typically, the switch 158 and/or server 110 is a stored-program-controlled system that conventionally includes interfaces to external communications links, a communications switching fabric, service circuits (e.g., tone generators, announcement circuits, etc.), memory for storing control programs and data, and a processor (i.e., a computer) for executing the stored control programs to control the interfaces and the fabric and to provide automatic contact-distribution functionality. Other types of known switches and servers are well known in the art and therefore not described in detail herein.

As shown in FIGS. 1 and 2, the CTI interface 160 and SIP gateway 162 may facilitate communications between the external communications devices 174-1 to 174-M and the first and second agent communications devices 134, 138. The SIP gateway 162, for example, can connect with one or more SIP trunks from the communications network 154 and split incoming aggregate SIP traffic into individual SIP sessions and aggregate the individual outbound SIP sessions. The security gateway 164 may be positioned between the server 110 and the communications network 154 to process information passing between the server 110 and the communications network 154. The security gateway 164 may be, for example, Avaya Inc.'s G700 Media Gateway™ and may be implemented as hardware such as via an adjunct processor (as shown) or as a chip in the server 110.

The servers and/or computers of the contact center 100 can also include a context store 127 and a harvest module 129. These two features are shown as separate systems in FIG. 2 but they can also execute on a single server or a single cluster of servers, which can be referred to as an experience manager. The harvest module 129 is configured to build or add data (or relevant information for customers) to the context store 127. The context store 127 includes a database or repository that stores various transit data, for example, data related to customer interaction. An additional database may be utilized by the harvest module 129 to process data, and to store other data. A contact or customer may communicate with disparate systems within the contact center 100 and these systems can retrieve data from the context store 127 or provide data to be stored in the context store 127.

In one embodiment, the harvest module 129 may communicate with a ticketing system, an order tool system, a sentiment analysis engine, a customer relationship management (CRM) system, and a business process management system (BPM) to build or add data to the context store 127. The harvest module 129 may communicate with these systems and provide updated data to the context store 127 according to various contacts that are being handled and monitored within the contact center 100.

In an example, following a customer interaction with an agent of the contact center 100, the harvest module 129 may update the context store 127. In another embodiment, the ticketing system, the order tool system, the sentiment analysis data, the customer relationship management (CRM) system, and the business process management system (BPM) may directly push information, as well as, extract it out of the context store 127.

As an example, the sentiment analysis data may include sentiment of a contact, for example, happy, angry, complain, etc. during an interaction of the contact with a contact center agent.

The CRM updates may include data about any update in customer or contact relation with the enterprise or the contact center. The order update information may include update about the total order placed by the contact. The call/interaction metrics may include call duration, number of participants, was call transferred, was supervisor involved, etc. Further, any component or system of the contact center 100, for example, a self-service system, can access the context store 127, retrieve the context information, update it, change it, put it back in again, and so on and so forth.

The harvest module 129 may harvest relevant data from disparate sources related to customers. For example, the harvest module 129 may harvest relevant data related to the customers from the context store 127. In one embodiment, the harvest module 129 harvests the sentiment analysis data, the CRM updates, the order update information, Post call/interaction survey, Call/interaction metrics, and any interaction context data, as described above. The harvest module 129 gathers this data and other information that has changed during, and in the aftermath of, the customer interaction.

The context store 127 may further store any information, for example, information related to interaction, information related to context of interaction, current information, or case information, and updated information. For example, once an agent finishes a call, the harvest module 129 can start processing and storing the information in the context store 127.

The context store 127 provides a centralized data cache to the various applications in the contact center 100. The context store 127 can provide a RESTful Web Service API so that other applications can set or get context information. While various database schemes may be contemplated, the context information stored about a contact is stored so that the information can be searched and retrieved based on any of a variety of data stored therein. For example, each entry in the context store can include a) a ContextID which is a text field that contains a unique identifier for the context entry; b) the data, which can include multiple key-value pairs; and c) a GroupID which allows logical groups of related context entries to be created.

As described herein, various data, or context, about a contact can be generated, retrieved and stored. This contextual information can include present attributes about the contact, a device associated with the contact, a location of a user associated with the contact, an identity of the user associated with the contact; devices and/or locations associated with past contacts involving the associated user or user device, social media information about the user associated with the contact, and past purchases, past inquiries, group affiliation and demographic information about the user associated with the contact. The contextual information can also include various information about contact center resources, agents, and problem resolution associated with past interactions with the user associated with a contact.

Although some embodiments are discussed with reference to a client-server architecture, it is to be understood that the principles of the present disclosure apply to other network architectures. For example, the present disclosure applies to peer-to-peer networks, such as those envisioned by SIP. In the client-server model or paradigm, network services and the programs used by end users to access the services are described. The client side provides a user with an interface for requesting services from the network, and the server side is responsible for accepting user requests for services and providing the services transparent to the user. By contrast, in the peer-to-peer model or paradigm, each networked host runs both the client and server parts of an application program. Additionally, the disclosure does not require the presence of packet- or circuit-switched networks.

Figure 3:
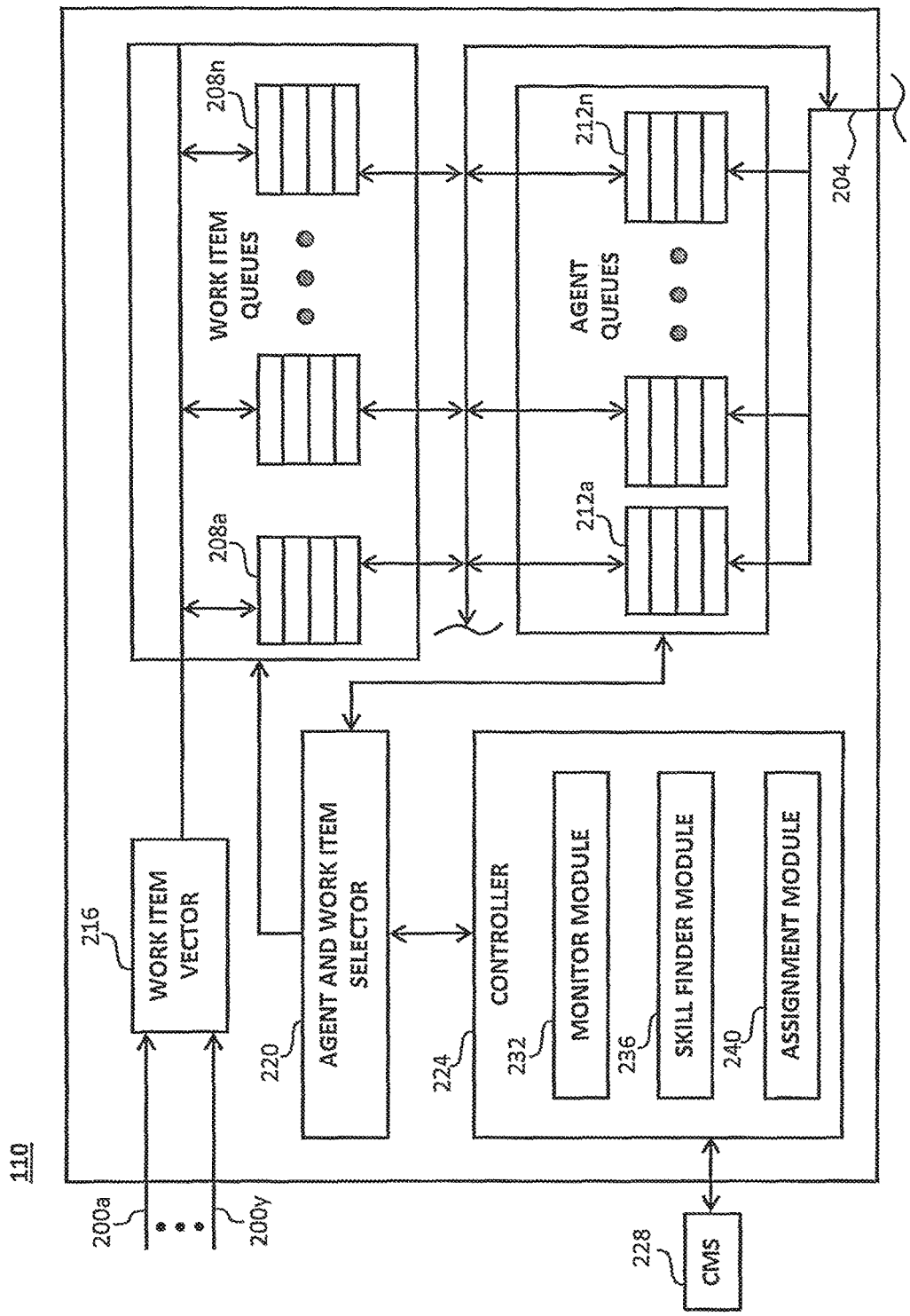
FIG. 3 illustrates a contact center server in accordance with principles of the present disclosure.

Referring to FIG. 3, one possible configuration of the central server 110 of a contact center 100 is depicted. The server 110 is in communications with a plurality of customer communications lines 200*a-y* (which may be one or more trunks, phone lines, etc.) and an agent communications line 204 (which may be a voice-and-data transmission line such as LAN 142 and/or a circuit switched voice line). The server 110 may include Avaya Inc.'s Operational Analyst™ (OA) with On-Line Analytical Processing (OLAP) technology or a Call Management System (CMS) 228 that gathers contact records and contact-center statistics for use in generating contact-center reports. The OA and the CMS will hereinafter be referred to jointly as CMS 228.

As may be seen in FIG. 3, included among the data stored in the server 110 is a set of work item queues 208*a-n* and a separate set of agent queues 212*a-n*. Each work item queue 208*a-n* corresponds to a different set of agent skills, as does each agent queue 212*a-n*. Conventionally, work items are prioritized and are either enqueued in individual ones of the work item queues 208*a-n* in their order of priority or in different ones of a plurality of work item queues 208*a-n* that correspond to a different priority. Likewise, each agent's skills are prioritized according to his or her level of expertise in that skill, and agents are either enqueued in individual ones of agent queues 212*a-n* in their order of expertise level or in different ones of a plurality of agent queues 212*a-n* that correspond to a skill and each one of which corresponds to a different expertise level.

Included among the control programs in the server 110 is a work item vector 216. Contacts incoming to the contact center are assigned by the work item vector 216 to different work item queues 208*a-n* based on a number of predetermined criteria, including customer identity, customer needs, contact center needs, current contact center queue lengths, customer value, and the agent skill that is required for the proper handling of the contact. Agents who are available for handling work items are assigned to agent queues 212*a-n* based on the skills that they possess. An agent may have multiple skills, and hence may be assigned to multiple agent queues 212*a-n* simultaneously. Furthermore, an agent may have different levels of skill expertise (e.g., skill levels 1-N in one configuration or merely primary skill levels and secondary skill levels in another configuration), and hence may be assigned to different agent queues 212*a-n* at different expertise levels.

In one configuration, the contact center may be operated by a contract operator, and each of the work item queues 208*a-n*, and possibly each of the agent queues 212*a-n*, corresponds to a different client. Each client may have a separate service level agreement or other type of performance measurement agreement with the contract operator regarding performance expectations, goals, requirements or specifications for the client's respective queue(s). The service level agreement may set forth penalties, such as financial penalties, for failing to comply with the service level agreement's requirements.

The contact center server 110 may be notified via the LAN 142 of an incoming work item by the communications component (e.g., the switch 130, fax server, e-mail server, web server, and/or other server) receiving the incoming work item. The incoming work item is held by the receiving telecommunications component until the server 110 forwards instructions to the component to forward or route the contact to a specific contact center resource, such as the IVR 122, one or more of the other servers such as a voice mail server 118, and/or a first or second agent communications device 134, 138 associated with a selected agent.

The server 110 distributes and connects these work items to first or second agent communications devices 134, 138 of available agents based on the predetermined criteria noted above. When the server 110 forwards a voice contact (or first work item) to an agent, the server 110 also forwards customer-related information from the database(s) 114 to the agent's computer work station for viewing (such as by a pop-up display) to permit the agent to better serve the customer. Depending on the contact center configuration, the server 110 may forward a list of work items to an available agent to preview before forwarding the work item itself and the data associated therewith to the agent. The agents process the work items or contacts sent to them by the server 110. This embodiment is particularly suited for a Customer Relationship Management (CRM) environment in which customers are permitted to use any media to contact a business. In a CRM environment, both real-time and non-real-time contacts must be handled and distributed with equal efficiency and effectiveness.

According to an embodiment of the present disclosure, also included among the programs executing on the server 110 are an agent and work item selector 220 and a controller 224, as shown in FIG. 3. The selector 220 and the controller 224 are stored either in the main memory or in a peripheral memory (e.g., disk, CD ROM, etc.) or some other computer-readable medium of the contact center 100. The selector 220 and the controller 224 collectively effect an assignment between available work items (or contacts) and available agents in a way that tends to maximize contact center efficiency for the current contact center state. The selector 220 uses predefined criteria in selecting an appropriate agent to service the work item. The controller 224 assists the work item vector 216 in routing the contacts to the appropriate work item queue(s) 208*a-n* and the selector 220 in routing a contact to a most desirable agent in the agent queue(s) 212*a-n*. The controller 224, in particular, obtains, for each of a plurality of contact center goals or objectives, status information, or information respecting whether or not a corresponding goal (for example, the service level agreement) is being met or unmet and/or a level to which the corresponding goal is being met or unmet.

Agent and customer profiles are typically maintained and updated by a profile generator (not shown). Upon the completion of handling a work item, the generator may collect selected metrics for the work item. These metrics include the skill involved in servicing the work item, the identifier of the servicing agent, the contact duration, the transaction or contact type (e.g., catalog sale, information request, complaint, etc.), the time-of-day, the result (e.g., the type of sale, the number of units sold, revenue generated, service ticket closure or escalation, the information provided, etc.), a self-rating of the servicing agent respecting the agent's proficiency in handling the work item, the rating of the customer of the agent's proficiency in handling the work item, the rating of another party, such as the agent's supervisor or another observer, of how the work item was serviced, whether the agent requested assistance, and whether the agent's training was completed, and stores the information in the database(s) 114, such as CMS 228. The metrics over a selected period of time are typically stored under each agent's profile and may include metrics associated with a plurality of work items serviced by the agent for each agent skill. Each agent's profile may also contain his or her skills and/or level(s) of skill expertise. Each customer profile includes metrics associated with a plurality of contacts by the customer.

The controller 224 has access to various performance measures of each of the agent resources and the contact handling history of the resources in the system. The controller 224 is also configured to use various systems, known in the art, to assess the performance of individual agent resources in processing work items. The controller 224 is further configured to find an area of competency for each of the agent resources based on their performance measures and contact handling history. The controller 224 is further configured to utilize such findings in maximizing contact center efficiency.

As mentioned above, the CTI interface 160 and SIP gateway 162 may facilitate communications between the external communications devices 174-1 to 174-M and the first and second agent communications devices 134, 138. The SIP gateway 162, for example, can connect with one or more SIP trunks from a provider's communications network 154 and split incoming aggregate SIP traffic into individual SIP sessions and aggregate the individual outbound SIP sessions, such as, for example, Avaya Inc.'s Session Border Controller™.

In addition, the contact center can include an ISDN gateway (not shown) that can, for example, connect with one or more ISDN trunks from a provider's network such that an ISDN interface is implemented on the provider's network side of the ISDN gateway and a SIP interface is implemented on the contact center's side of the ISDN gateway, such as, for example, Avaya Inc.'s Communication Manager™. The ISDN gateway receives ISDN-based messages from the provider's network such as, for example, from a central office (CO) of the public switched telephone network (PSTN) and generates a corresponding SIP-based message that is sent to one or more computers or systems within the contact center. In the opposite direction, the ISDN gateway receives a SIP-based message from within the contact center and generates a corresponding ISDN-based message that is sent to the provider's network. In this way, a SIP session (i.e., an ongoing call) within the contact center is associated with a corresponding ISDN call within the provider's network. Regardless of whether one or both of the different gateways are present, a SIP session within the contact center 100 can be connected with one or more applications, or servers (e.g., server 110) such as, for example, Avaya Inc.'s Oceana™ within the contact center 100. This application or server within the contact center 100 that participates in the SIP session may change during different phases of the ongoing call such that the SIP-based messages are sent to these other servers such as, for example, Avaya Inc.'s Aura Contact Center™ or Aura Experience Portal™. The contact center server may receive SIP-based messages from the direction of the provider network (e.g., from the ISDN gateway or SIP gateway 162) and provide outgoing SIP-based messages (e.g., to the ISDN gateway or SIP gateway 162) to cause ISDN-based messages or SIP-based messages to be sent to provider network 154. Within the contact center 100, this server, or another server, can manage a SIP session (i.e., an ongoing call) via, for example, a conference bridge in which different parties are connected and disconnected to the conference bridge during the ongoing call so that "media" can be exchanged between the connected parties. The parties can include the caller, human agents and supervisors affiliated with the contact center but can also include different media streams, on hold music, advertisements, monitor or recording connections, IVR menus, etc. The SIP messages and the SIP session provide the control mechanisms for managing what parties are connected with an ongoing call.

As used herein, a "message" in the above-identified environment includes any of the contextual information collected or generated during a contact with the contact center, and also includes portions of a chain of interactions between a customer and the contact center or internal interactions within the contact center. These customer interactions or internal interactions can involve a human agent or an automated agent. Interactions can be part of a chain of related interactions that comprise a "conversation". As described below, grouping related interactions into a conversation allows conserving storage space for storing information about the conversation.

Figure 4:
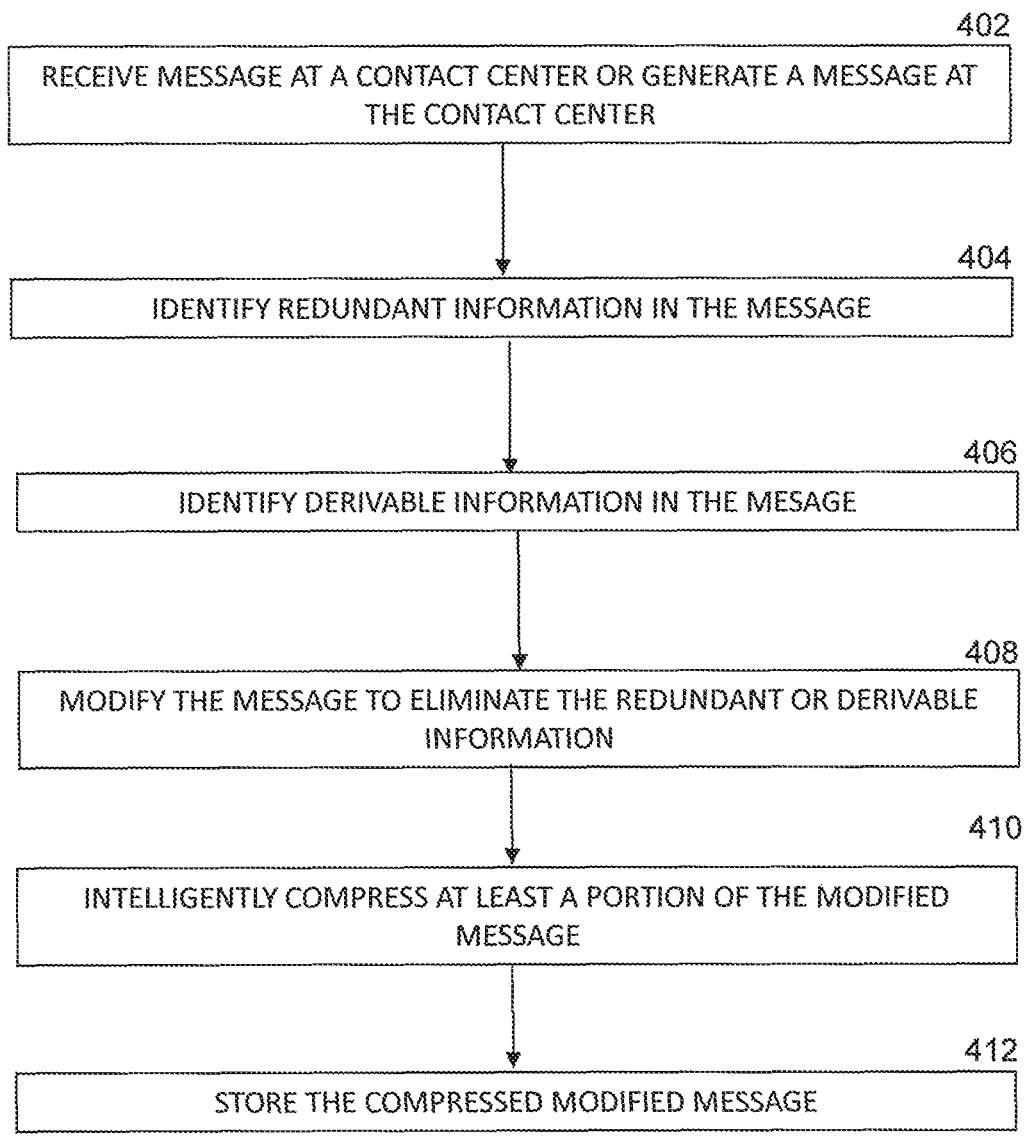
FIG. 4 is a flowchart of an example method of reducing space for storing content in accordance with the principles of the present disclosure.

FIG. 4 is a flowchart of an example method of reducing space for storing content in accordance with the principles of the present disclosure. In the process of handling a contact at the contact center 100, in step 402, a message is either received by the contact center 100 or generated by the server 110 or one of the other servers of the contact center 100. Thus, "receiving" a message encompasses receiving a message from a source external to the contact center or receiving a message generated by a server internal to the contact center 100. The message can include a wide variety of different data formats such as audio data, video data, textual data, e-mail messages, e-mail attachments, chat data, etc.

This message can be related to other messages within the contact center 100. For example, a message can have the same recipient as previous messages, or be related to the same subject as previous messages, or be received on the same day as previous messages. A basis for grouping messages can be selected so as to create a set of associated messages. Within that set of associated messages, information stored for one message can be reduced by referencing duplicate content in other messages of the group. One example way that messages can be related, or grouped, is that they are all part of a chain, or "conversation" of messages that involve a contact with the contact center and an agent of the contact center. Each message corresponds to an interaction within the conversation. There is a temporal sequence to the conversation such that each interaction occurs in a particular order with respect to other interactions within the conversation.

Accordingly, in step 404, the server 110 of the contact center 100 can identify within the message any information that is redundant information as compared to previous messages within the conversation. For example, in an e-mail chain there may be previous e-mail message bodies and attachments that are included in any reply messages or forwarded messages. Also, in step 406, the server 110 can identify any derivable information in the current message.

Derivable information can be any of a wide variety of information that can be determined relative to previously determined information. For example, the first message in a conversation can have a timestamp corresponding to its origination. Subsequent messages can have timestamps relative to the original timestamp. Thus, in the subsequent messages, a corresponding timestamp does not need to include the entire timestamp information (e.g., day, month, year, hour, minutes, seconds) but merely include a value relative to the original timestamp. This relative value can be, for example, "s+10" or "m+5" to indicate that is originated 10 seconds or 5 minutes, respectively, after the original message. In automated chat sessions, for example, there can be a predetermined script in which a series of questions is always asked to begin and end the session. These predetermined questions can be referred to with a label or other identifier without necessarily referring to their actual content. Similarly, an IVR or agent might follow a predetermined salutation portion of a script and a termination portion of a script in which the content between those two portions are what is of interest to be preserved by the contact center 100. In e-mail messages, for example, a signature block or a disclaimer may be included in all e-mail messages or an image may be included in a logo or other similar multimedia data. In each of these instances, the content of these data items is derivable from a data source external from the message itself without including the actual content of the item in a message.

In step 408, the message is modified to eliminate the redundant or derivable content. In some instances, the content can be entirely eliminated. In other instances, a reference to the content is substituted for the content. Thus, a link can be provided that points to the content and the link is smaller in size than the actual content. In other instances, the content of the message is modified to indicate how it is relative to, or different than, a previous message or messages. As discussed above, a relative timestamp is one relative type of content. Another example, is a forwarded e-mail in which only a new message body is identified along with recognizing an unchanged body of the original e-mail message.

Thus, the modified message from step 408 will be smaller in size as it does not include redundant information or the entire contents of information that is derivable from other sources. In step 410, the server 110 intelligently compresses the modified message. For example, there are a number of available and known compression algorithms that are recognized as more suitable than others depending on the type of data being compressed. Compression algorithms for textual data may not be as suitable for image compression as other algorithms optimized for compressing images. JPEG images and TIFF images may each have respective compression algorithms that achieve higher compression rates. For voice data, the codec used to encode the voice data may determine which compression algorithms achieve the highest compression rates for a particular set of voice data. Thus, in step 410, a previously determined compression algorithm is selected to compress at least portions of the modified message. In step 412, the modified and compressed message is stored. In this manner, the messages in a conversation involving the contact center can be stored so as to reduce the storage space used to preserve a record of the conversation.

Figure 5A:
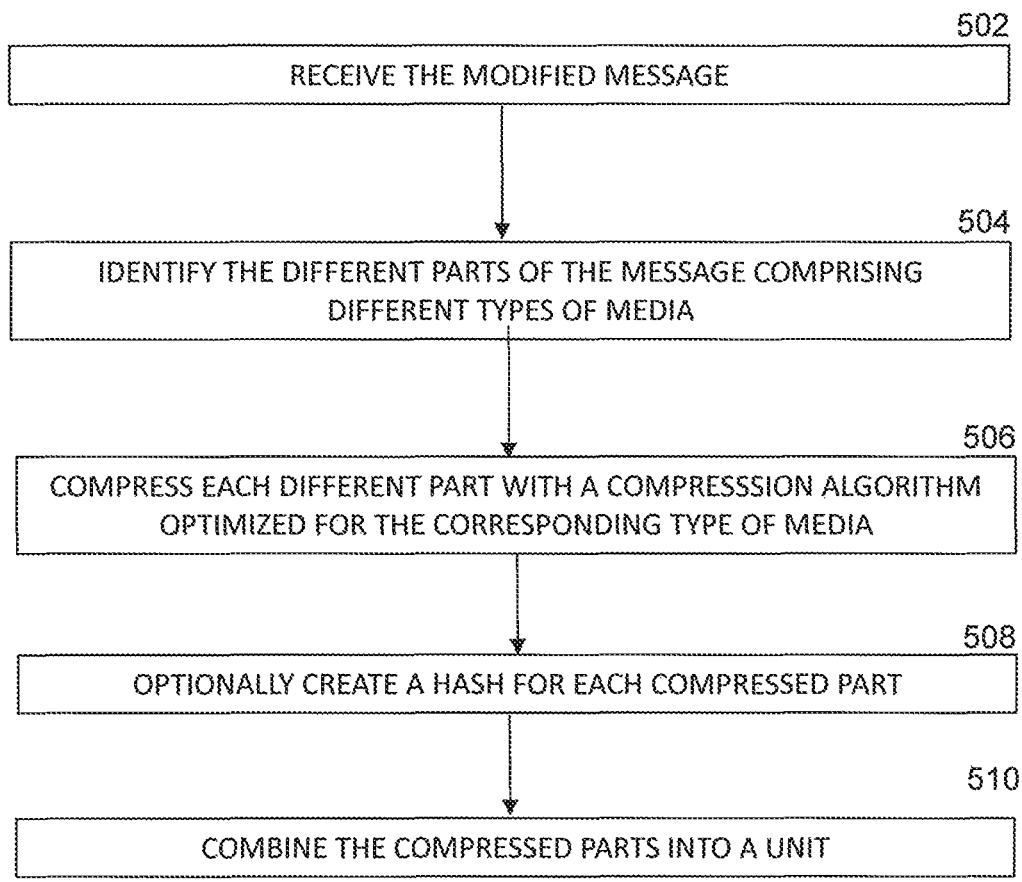
FIG. 5A is a flowchart of another example method of reducing storing content in accordance with the principles of the present disclosure.

FIG. 5A is a flowchart of an example method of compressing data in accordance with the principles of the present disclosure. FIG. 4 includes a step 410 that intelligently compresses a message in a conversation. FIG. 5A provides further details regarding this step.

In step 502, the modified message is received by the server 110 such that redundant or derivable information has been eliminated. The message can, for example, be a multipart MIME message that has different parts that each have a different format. The different formats can include application data (e.g., Excel, pdf, etc.), or textual data, or audio data, or image data, or video data, etc. Thus, in step 504, the server identifies the different parts of the modified message and their respective data formats or media types.

As discussed above, different media types may have specialized, or optimized, compression algorithms that perform better than other compression algorithms. Accordingly, each different media type has an associated compression algorithm that has been previously identified as being the algorithm to use to achieve a highest rate of compression for that media type. In addition to compression rate, the speed of an algorithm can also be considered in that a much slower algorithm that provides only minimal improvements over a faster algorithm can be avoided by selecting the faster algorithm. In step 506, each separate part of the modified message is compressed using the respective, selected algorithm for the media type corresponding to that message part.

In step 508, a hash value or digest of each compressed message part can be calculated. A hash value (or simply hash), also called a message digest, is a number generated from a block of data. The hash is substantially smaller than the block of data itself, and is generated by a formula in such a way that it is extremely unlikely that some other block of data will produce the same hash value. The server 110 can calculate and use the hash values to determine which parts of a subsequent message are different than corresponding parts of previous messages in a conversation.

The compressed parts of the modified message can then be combined, in step 510, in a way that associates them as a unit which is then stored. In a simple example, the different compressed parts can be stored as a single file or in a single folder in a filesystem accessible by the server 110. In another example, the different parts can be individually stored in one or more databases with a key or index value that associates them with one another. The associating of the different parts with one another can also be performed in a hierarchical manner in which the different parts of the message are combined so that they are associated with the other parts of the same message but are also associated with the other messages of the same conversation.

The above discussion describes the general principles of aspects of the present disclosure. In the paragraphs below, a detailed example in accordance with the principles of the present disclosure is provided. This detailed example is not intended to limit the appended claims to only encompass the specific aspects of the example but, instead, is intended to provide a concrete implementation that highlights the features described herein.

Figure 5B:
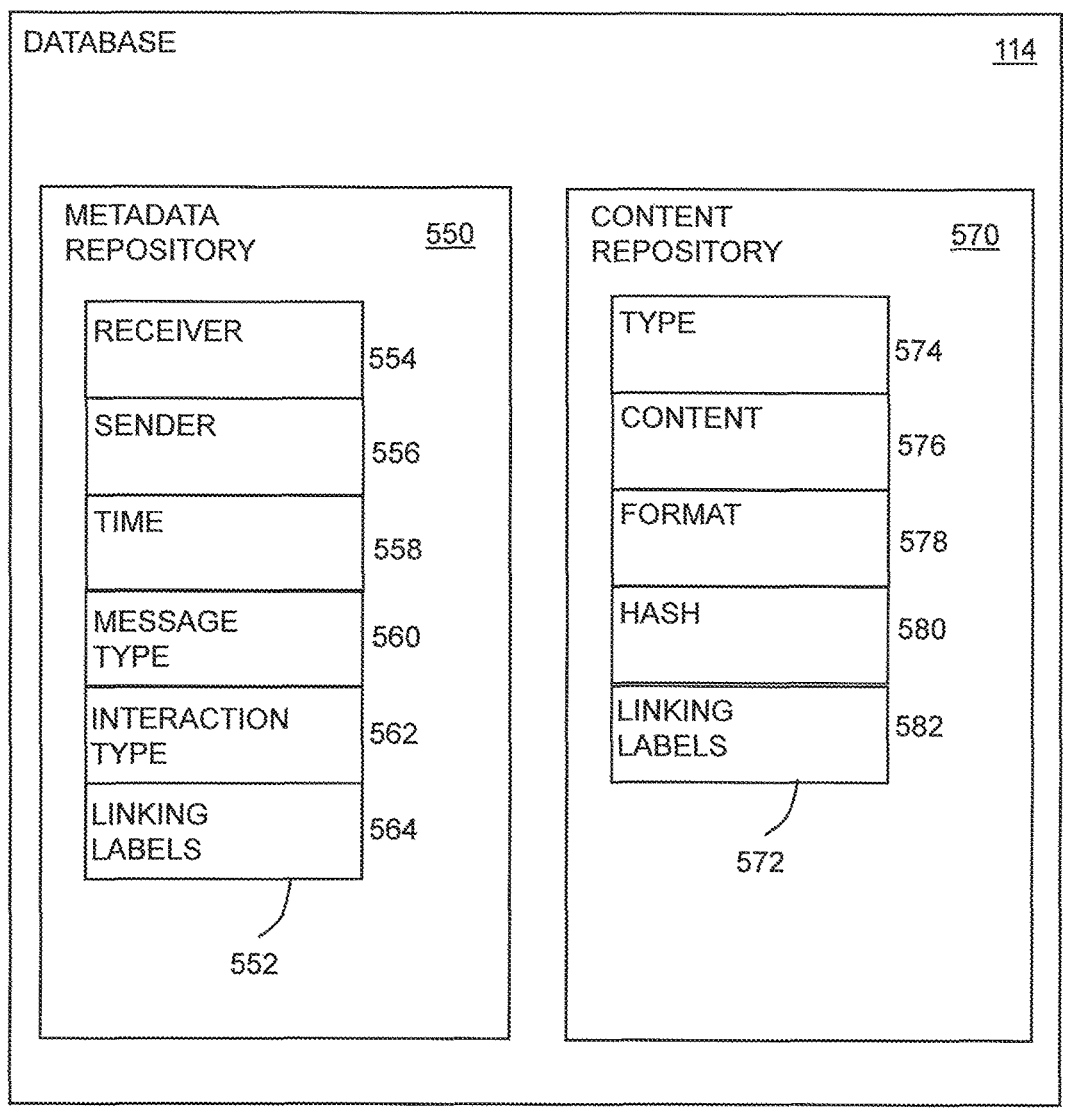
FIG. 5B illustrates an example repository configuration in accordance with the principles of the present disclosure.

This example is related to interactions that happen to occur via e-mail. Other types of interactions can occur such as voice calls, instant-messaging, chats, traversing IVR menus, etc. As shown in FIG. 5B, the databases 114 of the contact center 100 can include a metadata repository 550 and a content repository 570 configured for e-mail interactions. The metadata repository 550 stores a respective entry 552 for an interaction in which an e-mail message was exchanged, while the content repository stores a respective entry 572 that corresponds to one or more entries 552 in the metadata repository 550.

By way of example, each entry 552 in the metadata repository has a field 554 for storing the identity of the receiver of the e-mail message, a field 556 for storing the identity of the sender of the e-mail message, a field 558 for storing a time stamp of when the e-mail message was sent, a field 560 for storing the type of e-mail message (e.g., original, forward, reply, etc.), a field 562 for storing the type of interaction (e.g., inbound, outbound, internal, etc.), and a field 564 for storing some type of linking label.

As mentioned above, each entry 552 in the metadata repository 550 has a corresponding entry 572 (or entries) in the content repository 570. Respective linking labels in the entries 552, 572 can be used to create the logical association between the two entries. There can be linking labels 564 to link all the entries 552 that relate to one another and there can be linking labels 564 to link an entry 552 with a specific entry (or entries) 572 in the content repository 570. The linking labels 564, 582 can be such that they are one-way associative or two-way associative. If they are one-way associative, then the linking labels 564 of a particular entry 552 are used to identify the entries 572 associated with that particular entry 552. If they are two-way associative, then the linking labels 582 of a particular entry 572 are used to identify all of the entries 552 associated with that particular entry 572. One of ordinary skill will recognize that there are many other techniques, some of them automatically implemented in modern relational databases, that allow associations or links between entries in the two repositories 550, 570 to be implemented.

The fields of the entries 552 and 572 are examples that are relevant to e-mail messages. If the type of message were different such as a voice call or a video call, then the fields of the entries may be different so as to capture details relevant to those type of messages.

As described earlier, the content repository 570 stores a respective entry 572 that corresponds to one or more entries 552 in the metadata repository 550. An entry 572 can, for example, have a field 574 for storing an identifier of the type of data associated with the entry 572. For e-mail messages, example "types of data" can include the different parts of an e-mail message such as "Subject", "Body", "Attachment", etc. The entry 572 also includes a field 576 for storing the actual content of the data, and a field 578 for storing an identifier of the format of the data. Example formats may be "text", "JPEG", "MP3", "image", "XLS". For example, multipart MIME messages have standardized format types that can be stored in the field 578 (e.g., "image/JPG", "Application/xls", etc.). These format types are already included in the boundary portions between the different parts of the MIME message and their presence can be detected by simple lexical analysis of the message and used to separate the different parts of the e-mail message from one another as well as identify the corresponding format of that portion of the content of the e-mail message. In examples, outside of this particular example utilizing e-mail messages, the server 110 can use a file extension to identify the data format type, or the server 110 may identify the data format type based on the sender's identity that sent or created the data (e.g., a voicemail application, a video media server, etc.), or the server 110 can analyze the starting bytes of the data to determine the data format type information encoded in those bytes.

The entry 572 may also include a field 580 for storing a hash of the content stored in field 576. A hash of the content, such as for example an MD-5 digest, is a known technique for calculating a much smaller-sized value that corresponds to a relatively large-sized data. When the same hash algorithm, applied to two separate pieces of data, result in the same hash value, then the contents of the two separate pieces of data are considered to be copies of one another.

As described above, the entry 572 may also have a field 582 for storing linking labels that are used to logically associate different entries 572 with one another that are related to an ongoing conversation at the contact center 100.

1. Agent Receives E-mail from a Customer

As an initial step, in this detailed example, an agent of the contact center receives an e-mail from a customer. The e-mail, for example, may include two image attachments. The server 110 creates and stores an entry 552 in the metadata repository 550 with the fields 554-564 filled in based, in part, on the sender identity, the receiver identity, and the message origination time. For example, field 560 can store "Original" and field 562 can store "Inbound". The linking labels field 564 can include an identifier "C-1", for example, to identify this entry as being related to a particular conversation. The linking labels field 574 can also include an identifier "M-x", for example, to identify it as the $x^{th}$ message or entry of its conversation (e.g., C-1). The linking labels field 574 can also identify content entries in the content repository 570 are related to this particular metadata entry 552. One of ordinary skill would recognize that the example linking labels discussed above are merely one example of how to identify messages in a contact center. As an alternative, the servers of the contact center already have in place mechanisms for tracking a contact that is inbound, for example, to the contact center. As that contact is processed through the contact center's computers, data and messages are associated with the contact so that a data structure is built that stores the contents and sequence of messages, data and other media that were generated during the handling of the contact by the contact center. This contact data structure can then be stored in one or more databases 114 of the contact center.

The server 110 creates and stores four separate entries 572 in the content repository 570. The first of the four entries has "E-mail Subject" in its field 574 and "TXT" in its field 578. The server 110 can then select a predetermined compression algorithm that was identified as being particularly suitable for compressing content of the type "TXT" as compared to other compression algorithms. The e-mail's subject line is then compressed according to the selected compression algorithm and stored in field 576. A hash is calculated based on the compressed content and stored in field 580. The linking labels field 582 can, for example, store "C-1:M-x" to indicate this first entry is related to the entry in the metadata repository that corresponds to the $x^{th}$ message in the series of messages in conversation "C-1".

The second of the four entries has "E-mail Body" in its field 574 and "TXT" in its field 578. The server 110 can then select a predetermined compression algorithm that was identified as being particularly suitable for compressing content of the type "TXT" as compared to other compression algorithms. The e-mail's body is then compressed according to the selected compression algorithm and stored in field 576. A hash is calculated based on the compressed content and stored in field 580. The linking labels field 582 can, for example, store "C-1:M-x" to indicate this second entry is related to the entry in the metadata repository that corresponds to the $x^{th}$ message in the series of messages in conversation "C-1".

The third of the four entries has "Attachment" in its field 574 and "image/JPG" in its field 578. The server 110 can then select a predetermined compression algorithm that was identified as being particularly suitable for compressing content of the type "image/JPG" as compared to other compression algorithms. Thus, a different compression algorithm than the one selected to compress the e-mail's body can be selected to compress the attachment. The attached image is then compressed according to the selected compression algorithm and stored in field 576. A hash is calculated based on the compressed content and stored in field 580. The linking labels field 582 can, for example, store "C-1:M-x" to indicate this second entry is related to the entry in the metadata repository that corresponds to the $x^{th}$ message in the series of messages in conversation "C-1".

The last of the four entries has "Attachment" in its field 574 and "image/JPG" in its field 578. The server 110 can then select a predetermined compression algorithm that was identified as being particularly suitable for compressing content of the type "image/JPG" as compared to other compression algorithms. Thus, a different compression algorithm than the one selected to compress the e-mail's body can be selected to compress the attachment. The attached image is then compressed according to the selected compression algorithm and stored in field 576. A hash is calculated based on the compressed content and stored in field 580. The linking labels field 582 can, for example, store "C-1:M-x" to indicate this second entry is related to the entry in the metadata repository that corresponds to the $x^{th}$ message in the series of messages in conversation "C-1".

2. Agent Forwards E-mail to Supervisor

As the example continues, the agent forwards the e-mail message to a supervisor without changing anything regarding the original e-mail message received from the customer. The server 110 can determine this by calculating a hash value for the original parts of the e-mail message and determining that no content was modified. The new data consists of the body of an e-mail message in which the agent poses a query to the supervisor about the original message. The server 110 stores a new entry 552 in the metadata repository 550 and a new entry 572 in the content repository 570.

The new entry 552 includes a timestamp 558 that can be in a format relative to the timestamp of the previously stored entry, as discussed above. The field 560 can store that this new entry 552 is a "Forward" type e-mail message and the field 562 can indicate that this new entry 552 is an "Internal" type of interaction. The linking labels field 564 can reflect that this entry is related to other entries in conversation "C-1" and even include a label "M-2" which indicates the entry's sequence within the conversation "C-1" (i.e., "M-2", the second message.) The linking labels field 564 can also identify what entries in the content repository 570 are related to this particular message.

The entry 572 created in the content repository 570 includes the body of the new e-mail message with the agent's query to the supervisor. Thus, the entry 572 stores "E-mail Body" in its field 574 and "TXT" in its field 578. The compressed e-mail body is stored in field 578 and a hash is calculated and stored in field 580. The linking labels 564 of the metadata entry link that entry to the previous four entries in the content repository 570 and this new, related entry in the content repository 570. Thus, the previous four entries are not duplicated within the content repository 570 but can still be referenced as part of the message, or interaction, between the agent and the supervisor. In other words, information in this current message that is redundant in view of the previous messages of the conversation is not duplicated when this current message is stored in the content repository 570. However, that full content is available and can be identified using the metadata entry corresponding to the current message because that metadata entry is linked with all the related entries in the content repository 570.

3. The Supervisor Responds Back With A Spreadsheet Attachment

In response to the agent's query, the supervisor responds back with an e-mail message in which a spreadsheet is attached but omits the other two attachments of the original message. The server 110 creates an entry 552 in the metadata repository 550 and two new entries in the content repository 570. Hash values can be calculated to determine which parts of related, previous messages are unchanged.

The entry 552 includes fields which reflect that the current message is a reply message from the supervisor to the agent and is an internal type of interaction. The linking labels field 564 stores data that links this metadata entry 552 with the entries in the content repository 570 corresponding to the original subject line, the original e-mail body, the forwarded e-mail body and the two new entries. Because the two images attached to the original e-mail are not included in the supervisor's reply message, the linking labels 564 for this entry 552 do not identify those two image-related entries in the content repository 570.

The two new entries in the content repository 570 correspond to an entry for the body of the reply e-mail message from the supervisor to the agent and an entry for the attached spreadsheet. As discussed above each of these entries includes content that is suitably compressed and then hashed. Linking labels are then stored so that one or more associated entries in the metadata repository 550 can be identified.

4. The Agent Replies Back to the Customer

The next step in this example conversation is that the agent replies back to the customer's e-mail message by attaching the spreadsheet provided by the supervisor. The server calculates hash values to determine that no changes have been made to previous e-mail message contents. Thus, the server 110 creates and stores one entry 552 in the metadata repository 550 and one entry 572 in the content repository 570.

The one entry 552 indicates that the message is an outbound reply message to the customer from the agent and is the fourth message in this particular conversation. The entry 552 is also linked with the new entry 572 in the content repository 570 as well as the entries corresponding to the original e-mail subject line, the original e-mail body, and the spreadsheet attachment from the supervisor. The new entry 572 in the content repository 570 includes the body of the reply message as compressed text along with a corresponding hash value.

In the above-described example, the metadata repository 550 stores relatively small amounts of data for each e-mail interaction in a chain, or conversation, of interactions. However, the content repository 570 stores the content of these interactions without duplicating redundant content. The stored content of an interaction can reference previous interactions such that only changes relative to the previous interactions are stored and unchanged data is not.

The flowchart and block diagrams in the Figures illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). In addition, while the flowcharts have been discussed and illustrated in relation to a particular sequence of events, it should be appreciated that changes, additions, and omissions to this sequence may occur without materially affecting the operation of the disclosure. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as JAVA, SCALA, SMALLTALK, EIFFEL, JADE, EMER- ALD, C++, CII, VB.NET, PYTHON or the like, conventional procedural programming languages, such as the "c" programming language, VISUAL BASIC, FORTRAN 2003, PERL, COBOL 2002, PHP, ABAP, dynamic programming languages such as PYTHON, RUBY, and GROOVY, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or WAN, or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks. Alternatively, a symmetric multiprocessor (SMP) system or other configuration including a plurality of processors may be used.

These computer program instructions may also be stored in a computer readable medium that when executed may direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions that execute on the computer or other programmable apparatus provide processes for implementing the functions/acts specified in the flowchart and/or block diagram block or blocks.

While the exemplary embodiments illustrated herein show the various components of the system collocated, certain components of the system may be located remotely, at distant portions of a distributed network, such as a LAN and/or the Internet, or within a dedicated system. Thus, it should be appreciated, that the components of the system may be combined in to one or more devices, such as a switch, server, and/or adjunct, or collocated on a particular node of a distributed network, such as an analog and/or digital telecommunications network, a packet-switch network, or a circuit-switched network. It will be appreciated from the preceding description, and for reasons of computational efficiency, that the components of the system may be arranged at any location within a distributed network of components without affecting the operation of the system. For example, the various components may be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements may be wired or wireless links, or any combination thereof, or any other known or later developed element(s) that is capable of supplying and/or communicating data to and from the connected elements. These wired or wireless links may also be secure links and may be capable of communicating encrypted information. Transmission media used as links, for example, may be any suitable carrier for electrical signals, including coaxial cables, copper wire, and fiber optics, and may take the form of acoustic or light waves, such as those generated during radio-wave and infra-red data communications.

Figure 6:
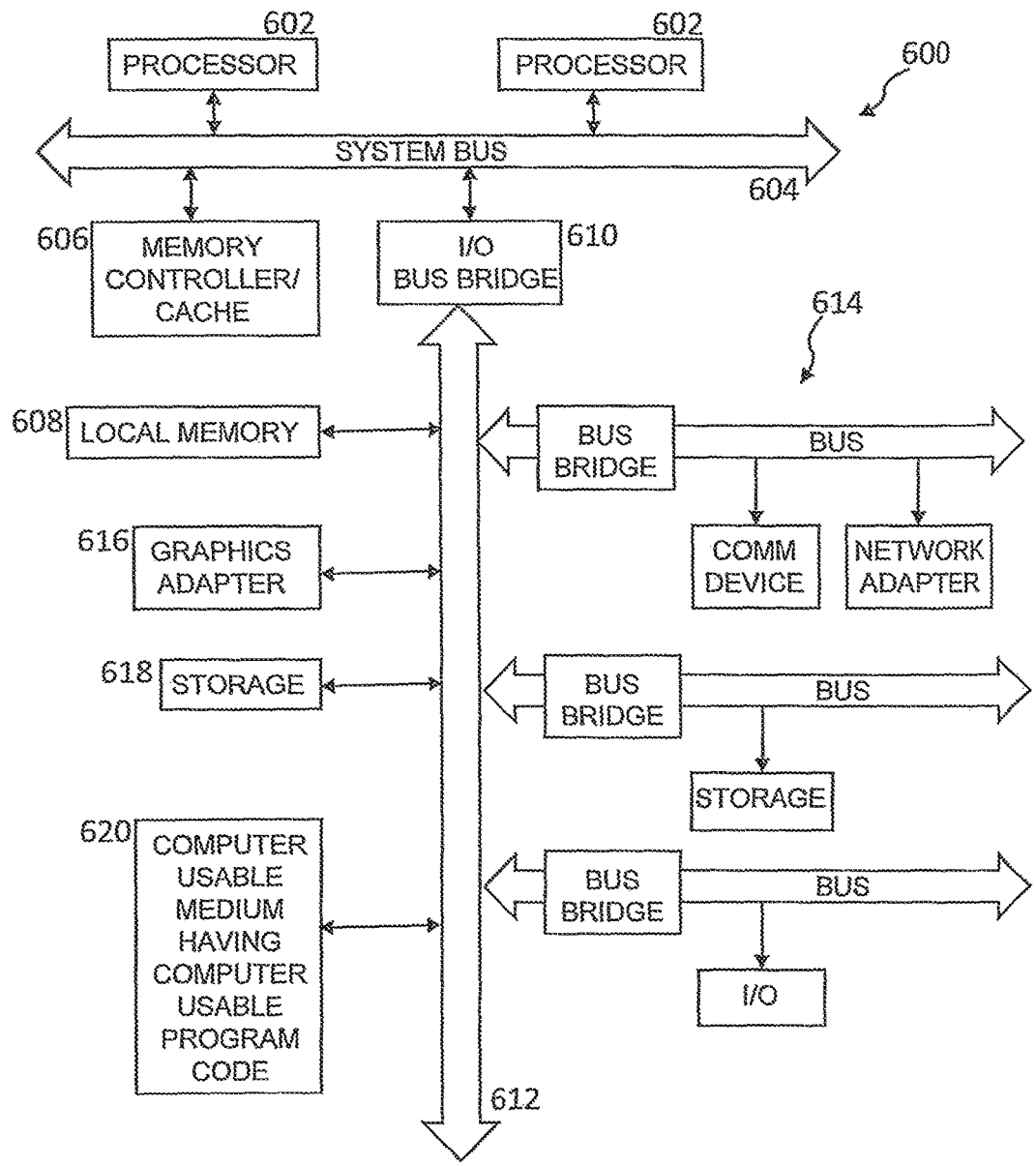
FIG. 6 illustrates an example computer platform in accordance with the principles of the present disclosure.

Referring to FIG. 6, a block diagram of a data processing system is depicted in accordance with the present disclosure. A data processing system 600, such as may be utilized to implement the computers or aspects thereof, e.g., as set out in greater detail in FIG. 1-FIG. 5B, may comprise a symmetric multiprocessor (SMP) system or other configuration including a plurality of processors 602 connected to system bus 604. Alternatively, a single processor 602 may be employed. Also connected to system bus 604 is memory controller/cache 606, which provides an interface to local memory 608. An I/O bridge 610 is connected to the system bus 404 and provides an interface to an I/O bus 612. The I/O bus may be utilized to support one or more busses and corresponding devices 614, such as bus bridges, input/output devices (I/O devices), storage, network adapters, etc. Network adapters may also be coupled to the system to enable the data processing system to become coupled to other data processing systems or remote printers or storage devices through intervening private or public networks.

Also connected to the I/O bus may be devices such as a graphics adapter 616, storage 618 and a computer usable storage medium 620 having computer usable program code embodied thereon. The computer usable program code may be executed to execute any aspect of the present disclosure, for example, to implement aspect of any of the methods, computer program products and/or system components illustrated in FIG. 1-FIG. 5B.

A number of variations and modifications of the disclosure may be used. It would be possible to provide for some features of the disclosure without providing others. For example, in one alternative embodiment, the systems and methods of this disclosure may be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein may be used to implement the various aspects of this disclosure. Exemplary hardware that may be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing may also be constructed to implement the methods described herein.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

While the foregoing is directed to embodiments of the present disclosure, other and further embodiments of the present disclosure may be devised without departing from the basic scope thereof. It is understood that various embodiments described herein may be utilized in combination with any other embodiment described, without departing from the scope contained herein. Further, the foregoing description is not intended to be exhaustive or to limit the present disclosure to the precise form disclosed. Modifications and variations are possible in light of the above teachings or may be acquired from practice of the present disclosure.

What is claimed is:

1. A method for storing a message in a conversation involving a contact of a contact center and an agent of the contact center, comprising:
   receiving, by a computer of the contact center, the message, wherein the conversation comprises a plurality of messages;
   identifying, by the computer of the contact center, redundant information in the received message that is redundant based on one or more of the plurality of messages;
   identifying, by the computer of the contact center, derivable information that is derivable from a data source external to the received message;
   generating, by the computer of the contact center, a modified message by eliminating the redundant information and the derivable information from the received message;
   compressing, by the computer of the contact center, the modified message using a data compression algorithm; and
   storing, by the computer of the contact center, the compressed modified message.

2. The method of claim 1, wherein the data source is one or more of the plurality of messages.

3. The method of claim 1, wherein the data source is one or more files stored in a memory accessible by the computer of the contact center.

4. The method of claim 1, wherein the modified message comprises a plurality of separate parts, each having a corresponding, respective data type.

5. The method of claim 4, comprising:
   separately compressing, by the computer of the contact center, each of the plurality of separate parts.

6. The method of claim 5, comprising:
   combining, by the computer of the contact center, the separately compressed parts into a unit, wherein storing the modified message comprises storing the unit.

7. The method of claim 5, comprising:
   selecting, by the computer of the contact center, a respective compression algorithm for each of the separate parts based on their corresponding data type.

8. The method of claim 1, wherein storing the modified message comprises:
   storing an entry in a metadata repository corresponding to the received message; and
   storing an entry in a content repository corresponding to the received message.

9. The method of claim 8, wherein the content repository comprises a plurality of entries corresponding to the plurality of messages, the method comprising:
   linking the entry in the metadata repository with one or more of the plurality of entries of the content repository that include content from which the derivable information is identified.

10. The method of claim 8, wherein the content repository comprises a plurality of entries corresponding to the plurality of messages, the method comprising:
    linking the entry in the metadata repository with one or more of the plurality of entries of the content repository that include content from which the redundant information is identified.

11. A system for storing a message in a conversation involving a contact of a contact center and an agent of the contact center, comprising:
    a memory device storing executable instructions;
    a processor in communication with the memory device, wherein executing the executable instructions by the processor causes the processor to:
      receive the message, wherein the conversation comprises a plurality of messages;
      identify redundant information in the received message that is redundant based on one or more of the plurality of messages;
      identify derivable information that is derivable from a data source external to the received message;
      generate a modified message by eliminating the redundant information and the derivable information from the received message;
      compress the modified message with a data compression algorithm; and
      store the compressed modified message.

12. The system of claim 11, wherein the data source is one or more of the plurality of messages.

13. The system of claim 11, wherein the data source is one or more files stored in a memory accessible by the computer of the contact center.

14. The system of claim 11, wherein the modified message comprises a plurality of separate parts, each having a corresponding, respective data type.

15. The system of claim 11, wherein executing the executable instructions by the processor causes the processor to:
    separately compress each of the plurality of separate parts.

16. The system of claim 15, wherein executing the executable instructions by the processor causes the processor to:
    combine the separately compressed parts into unit, wherein storing the modified message comprises storing the unit.

17. The system of claim 15, wherein executing the executable instructions by the processor causes the processor to:
    select a respective compression algorithm for each of the separate parts based on their corresponding data type.

18. The system of claim 11, wherein executing the executable instructions by the processor causes the processor to:

for the modified message, store an entry in a metadata repository corresponding to the received message; and for the modified message, store an entry in a content repository corresponding to the received message.

19. The system of claim 18, wherein the content repository comprises a plurality of entries corresponding to the plurality of messages, and wherein executing the executable instructions by the processor causes the processor to:

link the entry in the metadata repository with one or more of the plurality of entries of the content repository that include content from which the derivable information is identified.

20. The system of claim 18, wherein the content repository comprises a plurality of entries corresponding to the plurality of messages, and wherein executing the executable instructions by the processor causes the processor to:

link the entry in the metadata repository with one or more of the plurality of entries of the content repository that include content from which the redundant information is identified.

* * * * *